United States Patent [19]

Batey et al.

[11] Patent Number: 5,242,530
[45] Date of Patent: Sep. 7, 1993

[54] PULSED GAS PLASMA-ENHANCED CHEMICAL VAPOR DEPOSITION OF SILICON

[75] Inventors: John Batey, Danbury, Conn.; John J. Boland, Stormville; Gregory N. Parsons, Tarrytown, both of N.Y.

[73] Assignee: International Business Machines Corporation, Armonk, N.Y.

[21] Appl. No.: 740,759

[22] Filed: Aug. 5, 1991

[51] Int. Cl.$^5$ .................................... C30B 25/06
[52] U.S. Cl. ................................. 156/613; 156/610; 156/614; 156/DIG. 64; 156/DIG. 89; 437/89; 437/90; 437/106; 437/946
[58] Field of Search ....... 156/610, 613, 614, DIG. 64, 156/DIG. 89; 437/89, 90, 106, 946

[56] References Cited

U.S. PATENT DOCUMENTS

| 3,721,583 | 3/1973 | Blakeslee | 117/215 |
|---|---|---|---|
| 4,362,766 | 12/1982 | Dannhauser et al. | 427/39 |
| 4,579,609 | 4/1986 | Rief et al. | 156/612 |
| 4,579,621 | 4/1986 | Hine | 156/612 |
| 4,714,518 | 12/1987 | Satyanarayan et al. | 437/227 |
| 4,801,557 | 1/1989 | Wessels et al. | 437/81 |
| 4,826,784 | 5/1989 | Salerno et al. | 437/89 |
| 4,870,030 | 9/1989 | Markunas et al. | 437/81 |
| 4,900,411 | 2/1990 | Poong et al. | 204/157 |
| 4,933,300 | 6/1990 | Koinuma et al. | 437/110 |

OTHER PUBLICATIONS

"Preparation of Highly Photoconductive Hydrogenated Amorphous Silicon Carbide Films, etc.", Asano et al., J. Appl. Physics 65(6), Mar. 15, 1989, pp. 2439–2443.
"Low-Temperature Selective Epitaxial Growth of Silicon at Atmos. Pressure", Sedgwick et al., Appl. Physics Letters 54(26) Jun. 26, 1989, pp. 2689–2691.
"Selective Deposition of N+ Doped MC-SI:H:F by RF Plasma, etc.", by Baert et al., Mat. Res. Soc. Proc., vol. 164 (1990), pp. 359–364.
"Effects of Hydrogen Atoms on the Network Structure, etc.", Asano, Appl. Phys. Lett. 56(6), Feb. 5, 1990, pp. 533–535.
"Digital Chemical Vapor Deposition of SiO$_2$", Nakano et al., Appl. Phys. Lett. 57(11), Sep. 10, 1990, pp. 1096–1098.
"Radio Frequency Plasma Etching of Si/SiO$_2$, etc.", McNevin, J. Vac. Soc. Technical B 8(6), Nov. 1990, pp. 1185–1191.
"The Concept of Chemical Annealing, etc.", Shirai et al., Tech. Digest Int. PVSEC-5, Nov. 1990, pp. 59–62.
"Narrow Band-Gap a-Si:H with Improved Minority, etc.", Das et al., Jap. Jour. Appl. Phys., V30, No. 2B, Feb. 1991, pp. L239–L242.
"Role of Atomic Hydrogen During Growth ... Chemical Annealing", Shirai et al., Jap. Jour. Appl. Phys., V30, No. 4B, Apr. 1991, pp. L679–L682.

Primary Examiner—Robert Kunemund
Assistant Examiner—Felisa Garrett
Attorney, Agent, or Firm—Perman & Green

[57] ABSTRACT

A substrate having silicon receptive surface areas is maintained in a plasma enhanced chemical vapor deposition (PECVD) chamber at a temperature, and under sufficient gas flow, pressure and applied energy conditions to form a gas plasma. The gas plasma is typically made up of hydrogen, but may be made up of mixtures of hydrogen with other gasses. A discontinuous flow of silane gas of predetermined duration and predetermined time spacing is introduced to produce at least one timed pulse of silane gas containing plasma, whereby a thin layer of silicon is deposited on the receptive areas of the substrate. The thin layer of silicon is exposed to the hydrogen gas plasma between the brief deposition time cycles and may result in the modification of the silicon layer by the hydrogen plasma. The surface modification may include at least one of etching, surface hydrogenation, surface bond reconstruction, bond strain relaxation, and crystallization, and serves the purpose of improving the silicon film for use in, for example, electronic devices. Repeated time pulses of silane gas and subsequent hydrogen plasma exposure cycles can result in selective deposition of silicon on predetermined receptive areas of a patterned substrate. Selective deposition of silicon can serve the purpose of simplifying electronic device manufacturing, such as, for example, the fabrication of amorphous silicon thin film transistors with low contact resistance in a single PECVD pump-down procedure.

13 Claims, 2 Drawing Sheets

PULSED GAS PLASMA-ENHANCED CHEMICAL VAPOR DEPOSITION OF SILICON

BACKGROUND OF THE INVENTION

1. Field of the Invention

The invention relates to the controlled plasma-enhanced chemical vapor deposition and surface modification of silicon onto a substrate at low substrate temperatures using a hydrogen and silane gas plasma, and according to a preferred embodiment, the selective deposition and modification of silicon onto predetermined first surface areas of a substrate while preventing silicon accumulation on unintended second surface areas of the substrate in the course of a process in which silicon is deposited and accumulated in predetermined intended areas of the substrate, such as during the production of semiconductor devices.

2. Description of Prior Art

Plasma-Enhanced Chemical Vapor Deposition (PECVD) processes are well known for the deposition of silicon, including amorphous, microcrystalline, polycrystalline and/or epitaxial silicon, at low substrate temperatures (less than 300° C.) in a variety of electronic semiconductor device structures. Also, atmospheric pressure and low pressure chemical vapor deposition and ultra high vacuum chemical vapor deposition are used at higher temperatures for polysilicon and epitaxial silicon deposition.

It is known to selectively deposit silicon on certain areas of a substrate by epitaxial growth thereon at temperatures greater than 600° C., using chlorinated silanes and ultrapure gases, and reference is made to an article titled "Low Temperature Selective Epitaxial Growth of Silicon at Atmospheric Pressure", by T. O. Sedgwick et al., Applied Physics Letters, Vol. 54, No. 26, pages 2689-2691 (1989). Such processes are limited to use of high temperatures, chlorinated silanes, and certain substrates. The high temperature requirement limits the application of such processes, whereas a low temperature process can be applied, for instance, to amorphous silicon technology or to limit dopant diffusion in silicon devices with small dimensions.

It is also known in the plasma-enhanced chemical vapor deposition process to rotate a substrate within a multiplasma-zone apparatus into exposure with spatially-separated zones of hydrogen plasma and hydrogen:-silane plasma surrounded by an outer chamber containing no plasma, so as to expose the substrate to silane plasma, to deposit silicon on the substrate, and to expose the silicon deposit to hydrogen plasma, to passivate or modify the silicon surface, the plasma exposures being separated by rotation of the substrate out of exposure to either plasma. The effect of etching on the growth rate of the deposit is negligible, and no selective deposition is disclosed. Reference is made to an article titled "Preparation of highly photoconductive hydrogenated amorphous silicon carbide films with a multiplasma-zone apparatus" by A. Asano et al. in Journal of Applied Physics, Vol. 65, No. 6, 15 Mar. 1989, pages 2439-2944, and to an article titled "Effects of Hydrogen Atoms on the Network Structure of Hydrogenated Amorphous and Microcrystalline Silicon Thin Films" by A. Asano in Applied Physical Letters, Vol. 56, No. 6, pages 533 to 535, Feb. 5, 1990.

The processes disclosed by Asano have one or more disadvantages which are avoided by the present invention. The rotating-substrate apparatus used by Asano is complicated, appears to introduce contaminants such as oxygen, and is slow in operation. More importantly, the Asano process removes the substrate out of the plasma zones after each deposition and surface modification exposure, thereby interrupting the surface reactions produced by exposure to hydrogen plasma, such as etching, hydrogen radical assistance of the CVD deposition film growth, long range relocation for crystallization, formation of microcrystalline silica, etc.

It is also known to selectively deposit microcrystalline silicon:hydrogen:fluorine on crystalline and polysilicon surfaces, while not depositing on thermal silica sidewalls, to produce a self-aligned TFT structure in a plasma-enhanced CVD process, and reference is made to an article titled "Selective Deposition Of N+ Doped MC-Si:H:F By RF Plasma CVD On Si And $SiO_2$ Substrates", by K. Baert et al., in Materials Research Society Proceedings, Vol. 164, pp. 359-364 (1990). Such process balances etching from $SiF_4$, versus deposition from $SiH_4$ at temperatures above 300° C., namely 315°-330° C. $SiF_4$ causes substantial etching of the $SiO_2$ and therefore is undesirable. Also it is desirable to be able to produce selective deposition at temperatures below about 300° C., preferably in the area of 250° C., to apply the technology to amorphous silicon substrates.

Prior known processes for depositing silicon on a substrate have one or more deficiencies which render them unsatisfactory or inoperative for the selective deposition of silicon on predetermined areas of a substrate, at low temperatures of 300° C. or less in a conventional PECVD system using only hydrogen and silane gas plasma without requiring the use of fluorinated gas species.

SUMMARY OF THE INVENTION

The present invention relates to a novel plasma enhanced chemical vapor deposition (PECVD) process for separating the deposition and surface modification reaction by time modulating the flow of silane gas into a plasma zone receiving a continuous flow of hydrogen gas, to alternately deposit and modify silicon layers on a variety of surfaces, such as on a molybdenum or ITO (indium tin oxide) surface during the production of thin film transistor (TFT) semiconductor devices. The process is characterized by separating the deposition and surface modification reactions of the PECVD process by time modulating the flow of the silane gas into a hydrogen containing plasma within a deposition chamber associated with an appropriate substrate at low temperatures, preferably below about 300° C., to cause the deposition of a thin layer of silicon on said surface, or selectively on only predetermined desired areas of said surface, during the introduction of the pulses of silane gas, and to cause surface modification of the silicon film deposit at alternate time periods when the silane gas flow is discontinued to the deposition chamber, to permit the hydrogen gas to affect the surface in any one of several different ways which depend upon the nature of the surface(s) being treated and the duration of the alternate periods.

According to a preferred embodiment, silicon can be deposited selectively on desired areas such as areas of c-silicon, molybdenum, tantalum oxide, ITO, 7059 glass, plasma deposited microcrystalline silicon or polycrystalline silicon areas of a substrate while not accumulating on other unintended areas of different composition, such as fused silica, plasma deposited silicon nitride, 7059 glass, thermally-deposited silica, etc., by limiting the duration of the silane pulses, and/or by controlling the duration of the alternate time periods, when the substrate is treated with hydrogen, to cause the hydrogen to prevent accumulation of the silicon deposit in the unintended areas. In addition it is clear that the hydrogen affects the surface of the silicon deposit in the intended areas to enhance subsequent silicon deposit and to induce the formation of polycrystalline grain structure. Thus, the present modulation process enables the deposit and accumulation of thick layers of silicon on predetermined selected areas of a substrate while preventing the accumulation of silicon on adjacent areas of different composition.

DETAILED DESCRIPTION

Figure 1:
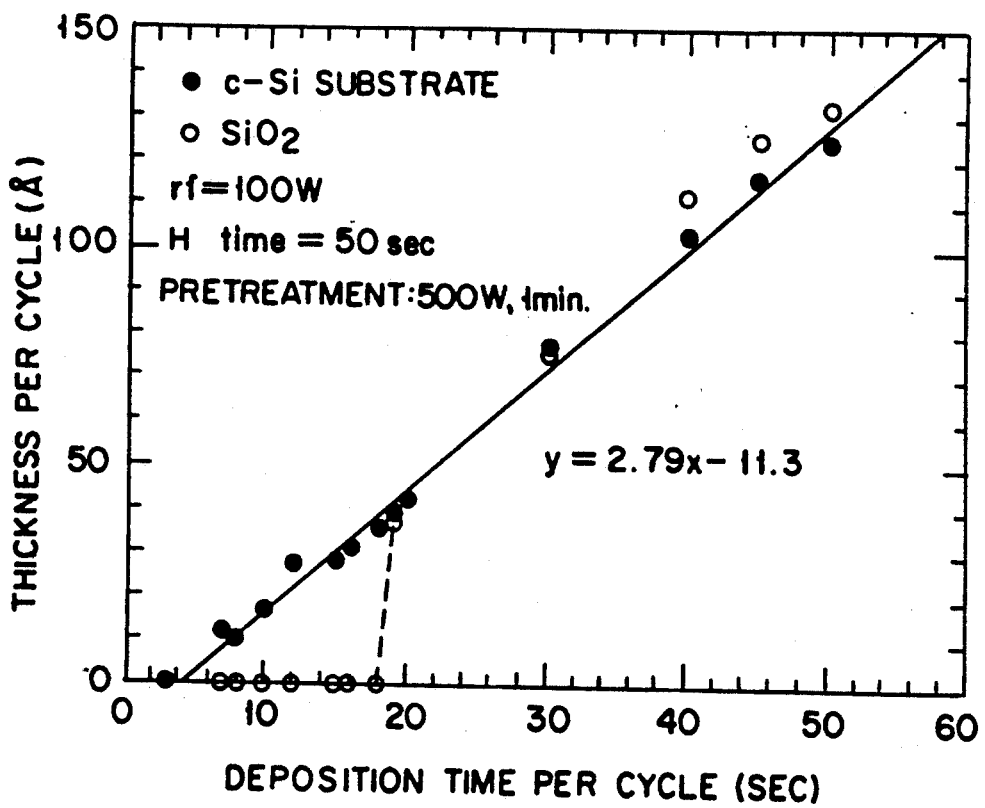
FIG. 1 is a graph illustrating the average layer thickness per deposition/hydrogen exposure cycle plotted against the silane pulse or deposition time.

The present invention involves the discovery that silicon films can be deposited and modified on predetermined surface areas of a substrate, and that, according to a preferred embodiment, selectivity can be obtained and controlled, relative to different substrate composition areas, by exposing the substrate to a continuous hydrogen plasma into which silane gas is modulated, and by controlling the gas modulation durations to limit the silicon plasma deposition time to one which produces selective deposition of silicon in predetermined first areas with no deposition or etchable deposition in adjacent areas of different composition, and to provide alternate hydrogen plasma durations which cause the hydrogen to react with and modify the deposited silicon as a microcrystalline silicon layer while preventing the accumulation of any silicon layer on the adjacent areas of the substrate. Thus, the deposition reaction of the silicon and the modification reaction of the hydrogen are separated and independently controlled by maintaining a continuous hydrogen plasma in the deposition chamber, and time-modulating the duration of introduction and non-introduction of silane gas to said chamber for predetermined periods which produce selective deposition and accumulation of a silicon coating on predetermined isolated areas of a multi-area substrate present in the deposition chamber, at low temperatures, such as below about 300° C., and in the presence of suitable RF power, such as between about 20 and 100 W. This produces sequential, independently-controlled deposition and surface treatment or surface modification steps, providing a new degree of control, at the atomic level, to the PECVD process.

By varying the modulation conditions, film deposition, modification and selectivity can be controlled on a variety of substrate surfaces, including crystalline silicon (undoped or n-type crystalline silicon which is doped with phosphine), fused silica, plasma-deposited silicon dioxide and silicon nitride, indium tin oxide, tantalum oxide, metals such as molybdenum, and other surfaces. For example, deposition can be selectively produced on surface areas of c-silicon while being avoided on adjacent surface areas of 7059 glass and thermally deposited silicon dioxide, or can be selectively produced on surface areas of different compositions such as 7059 glass while being avoided on adjacent surface areas of PECVD silicon dioxide, which adjacent areas can be patterned by standard techniques on a variety of substrate surfaces. The present process enables the use of a relatively low temperature, below about 400° C. and preferably about 250° C., which is advantageous in silicon device technology. A selective process is attractive for device fabrication, for instance, to form self-aligned structures to eliminate patterning and etching steps, or for the fabrication of thin film transistor (TFT) structures, where complete device formation, including contacts, semiconductor and gate dielectric layers, can be produced in a single PECVD pump-down operation.

The present process may be conducted in association with a conventional PECVD parallel plate reactor having electrodes of 28 cm. diameter (615 cm$^2$ area and 2 cm. spacing. The deposition chamber includes a radial gas flow system to which hydrogen and silane gases are fed through a conduit containing a mass flow controller. A valved gas line is connected to the conduit, downstream of the flow controller, to supply a modulated flow of silane gas to the conduit without interfering with the continuous flow of the hydrogen gas and without causing gas bursts. The silane gas valve preferably is an electrically-controlled solenoid diverter valve, associated with a variable electronic timing circuit, to permit the automatic supply of silane gas to the conduit and deposition chamber for predetermined, variable durations depending upon the nature of the multi-area substrate being treated. During alternate non-supply durations the silane gas flow is diverted to a process pump.

The RF power supply to the electrodes may also be programmable to allow for time modulation thereof. For example, it is preferred to expose the substrate to a hydrogen plasma pretreatment at a RF power supply of from 80 to 400 mW/cm$^2$ (115 W to 570 W) for from 1 to 10 minutes before film deposition is initiated. The pretreatment may possibly remove contamination from the substrate. During the deposition cycles the RF power supply is maintained between about 20 and 100 Watts with a pressure typically about 400 m Torr.

Conditions for film deposition will vary somewhat depending upon the identity of the compositions of the different surface areas of the substrate being treated. Typical conditions include a hydrogen gas flow rate of 100 standard cubic centimeters per minute (sccm), a silane (SiH$_4$) gas flow rate of about 5 sccm, a substrate temperature of about 300° C., RF power of about 20–100 Watts and pressure of about, 300 m Torr. The hydrogen gas flow to the deposition chamber is continuous and the silane gas flow to the deposition chamber is intermittent for predetermined on- and off- durations depending upon the substrate compositions.

FIG. 1 of the drawings illustrates the treatment of a substrate comprising adjacent areas of n-type crystalline silicon (111) and fused silica, more specifically a substrate having a base layer of the c-silicon covered by a surface layer of plasma-deposited silica on which trenches with dimensions down to 10 microns were patterned, by conventional photolithographic or other means, to expose the c-silicon base layer. As discussed above, the hydrogen gas flow was continuous and the duration of the silane flow (deposition time) was varied between 1 second and 50 seconds at 50 second intervals during which the substrate was exposed solely to the hydrogen plasma.

Film thickness was measured using a stylus profilometer. Scanning electron microscopy (SEM) was used to observe selective deposition in the trench samples, and Raman scattering and infrared absorbance were performed on relatively thick film (>0.5 microns) deposited on c-Si surfaces.

FIG. 1 shows the average layer thickness per deposition/hydrogen exposure cycle, plotted versus silane pulse (deposition) time. The RF power was 100 W, and the hydrogen exposure time was fixed at 50 seconds. Before deposition, the surfaces were exposed to 500 W $H_2$ plasma for 1 minute. As shown in FIG. 1, when the deposition time is less than four seconds, no deposition is observed on either the c-Si or the silica areas. As the deposition time is increased, a silicon film is deposited on c-Si surface areas, but not on fused silica surface areas. For deposition times greater than about 19 seconds, with fixed hydrogen plasma time, a silicon film with uniform thickness is deposited on all exposed surfaces. The number of deposition cycles used was sufficient to deposit more than 1000 Å on the c-Si surface. Using conditions for selective growth, films greater than 0.5 um thick have been deposited on the c-Si surface areas, with no visible film accumulation, as determined from optical transmission and SEM, on the fused silica surface areas. The linear increase in the deposited thickness indicates that the growth rate is constant, about 2.8 Å/sec., on crystalline silicon surfaces, and the non-zero intercept is evidence of etching of the deposited layer by the hydrogen plasma. The transition from selective to non-selective conditions in FIG. 1 occurs at a layer thickness of approximately 34 Å. We find that this transition layer thickness is not unique but depends on the conditions and duration of the hydrogen plasma exposure cycle.

Figure 2:
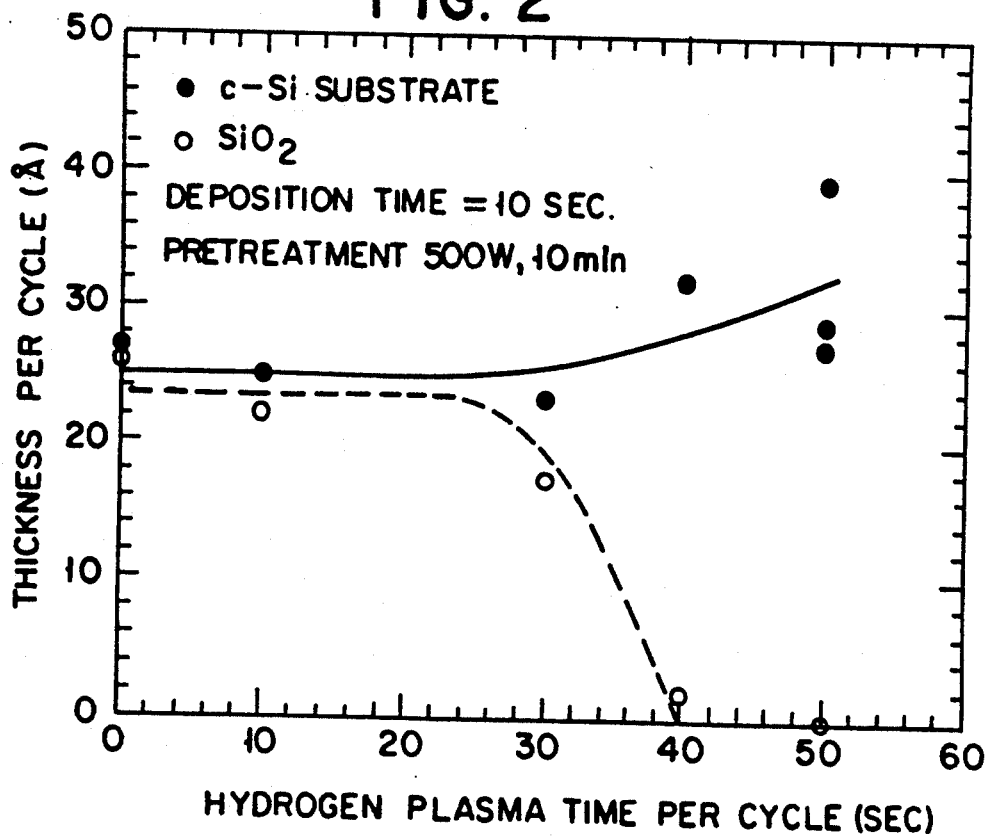
FIG. 2 is a graph illustrating the effects of the duration of the alternate hydrogen plasma exposure time on the thickness of silicon deposit on adjacent surface areas of c-silicon and fused silica.

FIG. 2 illustrates the effects of the duration of the hydrogen plasma cycle on the selectivity and thickness of silicon on adjacent surface areas of c-silicon and fused silica. The silane flow-time was 10 seconds per cycle.

Short $H_2$ plasma exposure times result in a uniform silicon film on all surfaces. As the $H_2$ plasma exposure time is increased, the film deposition thickness per cycle on crystalline silicon does not change significantly, while the deposition rate on fused silica decreases dramatically. When the hydrogen exposure time is high enough, above 40 seconds, no film accumulation is detected on fused silica substrates.

Process conditions and film thicknesses for a typical selective PECVD process are:

| | |
|---|---|
| $H_2$ Flow: | 100 sccm |
| $SiH_4$ Flow: | 5 sccm |
| Silane ON time: | 10 sec. |
| Silane OFF time: | 50 sec. |
| Substrate Temp.: | 300° C. |
| RF Power: | 100 Watts (68 mW/cm$^2$) |
| Pressure: | 400 mTorr |
| Number of cycles: | 180 |
| Total dep. time: | 3 hours |
| Substrate: | Film Thickness: |
| -fused silica | not detected |
| -c-Si | 4900 Å |

By adjusting the deposition conditions, including the silane ON and OFF times, this process can be used to selectively deposit on a variety of surfaces including Tantalum oxide, 7059 glass and metals, as discussed hereinbefore.

The pulsed gas process is believed to take advantage of differences in the chemical nature of the substrate to limit the growth of stable nucleii on less receptive surfaces. Limiting the silane flow allows a very thin layer of deposited silicon to be exposed to a hydrogen plasma for a controlled amount of time. The hydrogen plasma exposure appears to influence surface reconstruction and crystalline formation, and removes silicon atoms bonded in less stable configurations at the surface. The selectivity may result from differences in the nucleation on the different substrate surfaces, and the interaction of the deposited nucleii with hydrogen, where only the most stable nucleii will remain after the hydrogen plasma exposure cycle. Raman spectra of the deposited silicon show evidence of crystalline domains in the films. The selective deposition process may allow for control of the grain size, and may result in large grain polysilicon films deposited at low substrate temperatures.

Figure 3:
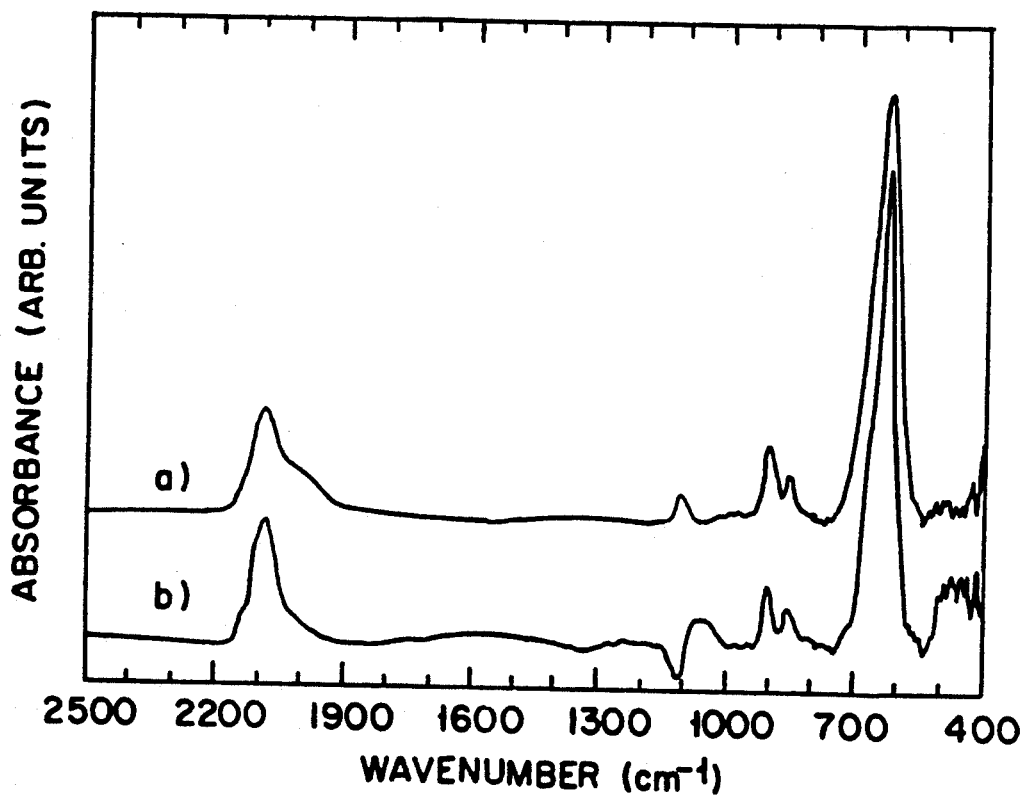
FIG. 3 is a comparative absorbance graph illustrating the infrared radiation absorbing spectra of two silicon films deposited on a crystalline silicon substrate, film (a) being deposited under continuous, non-selective gas flow conditions, and film (b) being deposited using pulsed silane gas under selective deposition conditions according to the present invention.

The infrared absorption for two films deposited on c-Si substrates are shown in FIG. 3 of the drawings. Film (a) is deposited under continuous, non-selective gas flow conditions, and film (b) is deposited according to the present invention, using pulsed silane gas under selective deposition conditions. The thickness of both films is about 0.5 micron and the absorbance scale is normalized for thickness. The absorption peaks at 2100 cm$^{-1}$ and 630$^{-1}$ have a full width of 60 cm$^{-1}$, significantly narrower than similar modes in hydrogenated amorphous silicon. The integrated absorption of the 630 cm$^{-1}$ mode is similar for the two films. For the film deposited with the pulsed gas process, the 2100 cm$^{-1}$ mode is larger and the shoulder at 2000 cm$^{-1}$ is reduced compared to the film produced with continuous gas flow. Raman absorption measurements show a strong absorption at 520 cm$^{-1}$, indicative of micro- or polycrystalline structure in the films.

A variety of other materials were investigated for selective deposition, including plasma deposited silicon dioxide and silicon nitride, 7059 glass, indium tin oxide, tantalum oxide and molybdenum. Selectivity can be tuned on many of these materials by controlling the gas modulation times. The chemical composition of the substrate, cleanliness and surface pretreatment all influence the conditions for selectivity. For example, by tuning the pretreatment conditions and gas modulation times, a deposition can be made on 7059 glass, while no film is deposited on plasma or thermal $SiO_2$ surfaces Low temperature glass (7059) contains a relatively high concentration of contaminants, and it appears that contaminant atoms at the surface enhance the nucleation of silicon.

Insight into the influence of substrate chemistry and film precursors on nucleation of amorphous and microcrystalline silicon-hydrogen films in PECVD processes has recently been obtained from in-situ ellipsometry.

The size of the nucleii and the density of nucleation sites are found to be sensitive to process conditions and substrate chemistry and a distinct transition from clustered nuclei to uniform film coverage has been observed. The present observations of selective deposition are consistent with the nucleation being dependent on the substrate surface chemistry; the different nucleii on the various substrate surfaces are effected differently by the hydrogen plasma treatment. The non-zero intercept of the data in FIG. 1 illustrates that the etching effect of the hydrogen plasma plays an important role in achieving selective deposition. The sharp transition from zero growth (selective deposition) to continuous film growth on $SiO_2$ surfaces occurs at a layer thickness of approximately 34 A. The transition layer thickness is not unique but depends on the conditions and duration of the hydrogen plasma exposure cycle. This is consistent with a hydrogen plasma etching process in which the etch rates are dependant on film nucleation and determined by the substrate surface. Specifically, material deposited on $SiO_2$ is etched at a faster rate than films deposited on c-Si. The data in FIG. 1, illustrates that at 100 W RF power, the etch rate is 0.79 A/sec for material on $SiO_2$ and is 0.22 A/sec for material on c-Si with a deposition rate of 3.0 A/sec during the silane pulse time. Similar results at 20 W RF give etch rates of 0.28 and 0.06 A/sec for films on SiO and c-Si respectively, with a growth rate of 1.5 A/sec. These results and the selectivity on other substrates show that lower etch rates may be related to a higher degree of crystallinity in the initial stages of film deposition on crystalline surfaces.

The role of hydrogen on the nucleation and formation of microcrystalline silicon is not completely clear. The present process shows evidence for etching, but other models, including long range relaxation, or "chemical annealing", as well as enhanced mobility of surface species by hydrogen coverage cannot be ruled out. Based on scanning tunneling microscopy analysis, it appears that atomic hydrogen can act to reconstruct an amorphous silicon surface and lead to the formation of crystalline domains of variable grain structure, as can be controlled by the duration of silane modulation and other conditions.

The present process is useful in connection with the production of thin film transistor (TFT) semiconductor devices to avoid the necessity of using a patterning step to etch n-type doped silicon contact layers. For example, isolated molybdenum-coated indium tin oxide (ITO) electrode areas may be formed on a 7059 glass substrate by conventional photolithographic patterning steps. Then the n-type silicon layer may be applied according to the present process and selectively accumulates over the molybdenum areas while the 7059 glass is not receptive and/or retentive thereof.

Thereafter, successive blanket layers or overall coatings of undoped amorphous silicon, and silicon nitride or silicon dioxide (gate dielectric) are applied over the entire substrate, without breaking vacuum. Molybdenum or aluminum (gate metal) are then applied to form the TFT semiconductor device. The resulting devices have low off currents and low contact resistance, demonstrating that the selective deposition process is viable for device applications.

It will be apparent to those skilled in the art that the novel preferred selective process of this invention is applicable to the production of a wide variety of semiconductor products and related products in which it is desired to apply silicon to only predetermined selected areas of a substrate having adjacent surface areas of different compositions having different receptivity and retentivity for silane plasma in the PECVD process, using only hydrogen and silane gases.

It will also be understood that while the primary gasses that are used in accordance with the present invention are hydrogen and silane; various amounts of other gasses may be present for various processing reasons, including halogenated species, but these other gasses are generally not required.

It is to be understood that the above described embodiments of the invention are illustrative only and that modifications throughout may occur to those skilled in the art. Accordingly, this invention is not to be regarded as limited to the embodiments disclosed herein but is to be limited as defined by the appended claims.

We claim:

1. A plasma-enhanced continuous chemical vapor deposition process for producing the selective deposition of silicon on first surface areas of a substrate containing said first surface areas adjacent second surface areas of different composition, comprising the steps of:
   (a) providing a substrate having said first and second surface areas, said first surface areas being selectively receptive to the PECVD deposit and accumulation of silicon;
   (b) placing said substrate within a PECVD deposition chamber and introducing a flow of hydrogen gas under sufficient applied energy to form a hydrogen gas plasma, said chamber being at temperature and pressure conditions suitable for PECVD;
   (c) modulating the introduction of silane gas to said deposition chamber for brief deposition time cycles to cause silicon to be selectively deposited and accumulated on said first surface areas, and
   (d) exposing said substrate to said hydrogen gas plasma during surface modification time cycles, between said brief deposition time cycles, to cause said hydrogen gas plasma to modify the surface of the silicon deposited on said firs surface areas and to prevent the accumulation of silicon on said second surface areas.

2. A process according to claim 1 wherein a surface of said deposited silicon is modified on said surface areas and rendered more receptive to the deposit and accumulation of additional silicon in subsequent deposition time cycles, and the accumulation of silicon on said second surface areas is prevented.

3. A process according to claim 2 wherein when the surface of said deposited silicon is modified by at least one of etching, crystallization, surface hydrogenation, surface reconstruction and bond strain relaxation occurs.

4. A process according to claim 1 wherein said flow of hydrogen is discontinuous.

5. A process according to claim 1 in which said substrate comprises a base layer of a first composition having thereover a surface layer of a different composition, preselected areas of which are removed to expose said base layer as first surface areas adjacent said surface layer as said second surface areas.

6. A process according to claim 5 in which said preselected areas are in the form of a pattern.

7. A process according to claim 1 in which said first surface areas of said substrate comprise a material selected from the group consisting of crystalline silicon, tantalum oxide, indium tin oxide, microcrystalline silicon, polycrystalline silicon, low temperature glass and a metal.

8. A process according to claim 7 wherein the metal is molybdenum.

9. A process according to claim 1 in which said second surface areas of said substrate comprise a material selected form the group consisting of fused silica, thermally-deposited, silica, plasma-deposited silicon dioxide, thermally deposited silicon dioxide, plasma deposited silicon nitride and thermally deposited silicon nitride.

10. A process according to claim 1 in which said first surface areas of said substrate comprise crystalline silicon and said second areas of said substrate comprise silica, and said deposition time cycles have a duration of from about 4 up to about 19 seconds to produce selective deposition of silicon on said first surface areas.

11. A process according to claim 1 which comprises subjecting said substrate to a hydrogen plasma pretreatment to prepare and clean a surface thereof.

12. A process according to claim 1 conducted at a deposition temperature of below 300° C.

13. A process according to claim 1 conducted at a deposition temperature of approximately 250° C.

* * * * *